(12) United States Patent
Kim

(10) Patent No.: US 7,145,363 B2
(45) Date of Patent: Dec. 5, 2006

(54) LEVEL SHIFTER

(75) Inventor: Seung-lo Kim, Icheon-shi (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 33 days.

(21) Appl. No.: 10/977,378

(22) Filed: Oct. 29, 2004

(65) Prior Publication Data
US 2005/0168241 A1    Aug. 4, 2005

(30) Foreign Application Priority Data
Feb. 4, 2004    (KR) ...................... 10-2004-0007348

(51) Int. Cl.
*H03K 19/0175*    (2006.01)
(52) U.S. Cl. .......................................... 326/68; 326/83
(58) Field of Classification Search ............ 326/68–72, 326/81–83, 86
See application file for complete search history.

(56) References Cited

U.S. PATENT DOCUMENTS 5,781,026 A * 7/1998 Chow ........................... 326/26
6,002,290 A * 12/1999 Avery et al. ................. 327/333
6,433,582 B1    8/2002 Hirano ......................... 326/68
6,501,306 B1 * 12/2002 Kim et al. .................... 327/112
6,510,089 B1    1/2003 Taura et al. ............ 365/189.11

FOREIGN PATENT DOCUMENTS

KR    10 1999 0057843    7/1999

* cited by examiner

*Primary Examiner*—Don Le
(74) *Attorney, Agent, or Firm*—Marshall Gerstein & Borun LLP

(57) ABSTRACT

In a level shifter for receiving a signal of a first voltage level and outputting a signal of a second voltage level, a pull-down driver pulls down a voltage level at an output terminal of the level shifter to a ground voltage level. A pull-up driver and an auxiliary pull-up device pull up the voltage level at the output terminal to the second voltage level. The level shifter can reduce leakage current and avoid operation delay of a device through the pull-up and pull-down drivers and that can implement a small-sized, lightweight and highly integrated semiconductor memory device.

7 Claims, 4 Drawing Sheets

LEVEL SHIFTER

BACKGROUND OF THE INVENTION

1. Field of the Invention

The present invention relates to a level shifter, and more particularly to a level shifter of a semiconductor memory device that can reduce leakage current and avoid operation delay of the device and that can implement a small-sized, lightweight and highly integrated device.

2. Description of the Related Art

A semiconductor memory device is a device capable of implementing Complementary Metal Oxide Semiconductor (CMOS) transistors and passive devices on a silicon wafer and writing and reading data. Most of the semiconductor devices are mounted on a board serving as an important element configuring a system. A semiconductor device externally receives an appropriate drive voltage (typically indicated by Vcc or Vdd). In some cases, a semiconductor device must internally generate a voltage less or higher than Vdd.

In this case, circuits using power supply voltages with different voltage levels must be coupled to a device for converting a voltage level. Otherwise, there is a problem in that a corresponding circuit or device may erroneously operate. For example, the semiconductor device of a Dynamic Random Access Memory (DRAM) configures a logic device using a CMOS transistor having an inverter function. In this case, where a voltage at a source terminal of a P-channel Metal Oxide Semiconductor (PMOS) transistor (hereinafter, referred to as "PMOS") is a threshold voltage higher than that at its gate terminal, that is, Vgs<Vth (wherein Vgs denotes a voltage difference between gate and source terminals of the PMOS and Vth denotes the threshold voltage of the PMOS), the PMOS must be turned off. However, there is a problem in that the PMOS may not be fully turned off because of physical characteristics of the PMOS. If the voltage at the source terminal of the PMOS is higher than that at the gate terminal of the PMOS and a voltage difference is less than the threshold voltage, there is another problem in that leakage current is incurred and hence circuit characteristics are degraded. In order to solve the problem, a special voltage level-shifting device, i.e., a level shifter, is used when a circuit based on a different drive voltage level is provided.

FIG. 1A is a circuit diagram illustrating a conventional level shifter. FIG. 1A shows the level shifter that receives a voltage V1 of a first voltage level and outputs a voltage V2 of a second voltage level. An input signal inputted into the level shifter is a signal having both V1 and Vss levels.

A circuit operation will be described with reference to FIG. 1A. Here, a node A is coupled between a PMOS P1 provided in a pull-up driver 100 and an N-channel Metal Oxide Semiconductor (NMOS) transistor (hereinafter, referred to as "NMOS") N1 provided in a pull-down driver 200, and a node B is coupled between a PMOS P2 provided in the pull-up driver 100 and an NMOS N2 provided in the pull-down driver 200.

First, when an input signal inputted into the level shifter is a Vss level signal, an inverter I10 inverts the input signal and a voltage at a node C has a V1 level, such that the NMOS N1 is turned on and a voltage at the node A is in a Vss level state by a pull-down operation. Subsequently, the PMOS P2 is turned on in response to a Vss level signal at the node A, and a voltage at the node B is in a V2 level state by a pull-up operation. Thus, when the input signal is the Vss level signal, the voltage of an output signal of the level shifter has the Vss level after a signal from the node B is inverted by an inverter I30. Here, the NMOS N2 receives the Vss level signal from a node D through its gate and is in an OFF state, after an inverter I20 inverts the signal from the node C. The PMOS P1 receives the V2 level signal from the node B and is in the OFF state.

At this point, when the input signal is shifted from the Vss level signal to the V1 level signal, the inverter I10 inverts the input signal, such that a voltage level at the node C is shifted from the V1 level to the Vss level. The NMOS N1 receiving the Vss level signal through its gate is turned off. After the inverter I20 inverts the signal from the node C, a voltage level at the node D is shifted from the Vss level to the V1 level. As the NMOS N2 receives the V1 level signal from the node D through its gate and is switched from the OFF state to the ON state, a voltage level at the node B is shifted from the V2 level to the Vss level by the pull-down operation. After the signal from the node B is inverted by the inverter I30, a voltage level of the output signal is shifted from the Vss level to the V2 level.

At this point, as the voltage level at the node B is shifted from the V2 level to the Vss level, the PMOS P1 receives the Vss level signal through its gate and is switched from the OFF state to the ON state, such that the voltage level at the node A is pulled up to the V2 level by the pull-up operation. The PMOS P2 receives the voltage of the V2 level from the node A through its gate and is switched from the ON state to the OFF state. Consequently, when the input signal level is shifted from the Vss level to the V1 level, the output signal level is shifted from the Vss level to the V2 level.

Subsequently, when the input signal level is again shifted from the V1 level to the Vss level, the voltage level at the node C is shifted from the Vss level to the V1 level and the NMOS N1 is turned on. Thus, the voltage at the node A is shifted from the V2 level to the Vss level by the pull-down operation. Because the PMOS P2 receives the voltage of the Vss level from the node A and is switched from the OFF state to the ON state, the voltage level at the node B is shifted from the Vss level to the V2 level by the pull-up operation. Thus, after the signal from the node B is inverted by the inverter I30, the output signal level is shifted from the V2 level to the Vss level.

At this point, as the voltage level at the node D is shifted from the V1 level to the Vss level, the NMOS N2 is switched from the ON state to the OFF state. The PMOS P1 receives the voltage of the V2 level from the node A through its gate and is switched from the ON state to the OFF state. Consequently, when the input signal level is shifted from the V1 level to the Vss level, the output signal level is shifted from the V2 level to the Vss level.

The level shifter plays a role for receiving a signal of a predetermined voltage level and outputting a signal of a different voltage level by repeating a series of operations described above. However, while the circuit operates in the conventional level shifter, the PMOS P1 and NMOS N1 or the PMOS P2 and NMOS N2 can be simultaneously turned on at the moment when the input signal level is shifted. Thus, as an electric current channel is incurred between a V2 power supply and ground, there are problems in that leakage current is incurred and a voltage level-shifting operation for the output signal is delayed.

That is, when the input signal level is shifted from the Vss level to the V1 level, the voltage level at the node D is shifted from the Vss level to the V1 level. The NMOS N2 receives a signal of the V1 level from the node D and is switched from the OFF state to the ON state. Thus, the voltage level at the node B is shifted from the V2 level to the Vss level by the pull-down operation. At this point, the PMOS P2 must be fully turned off. However, as the PMOS P2 and the NMOS N2 are simultaneously turned on because the PMOS P2 is not fully turned off and maintains the ON state for a predetermined time, an electric current channel is formed and hence leakage current may flow from the V2 power supply to the ground. This leakage current causes operation delay when the voltage level at the node B is shifted from the V2 level to the Vss level. Consequently, there is another problem in that the operation delay is incurred when the voltage level is shifted from the Vss level to the V2 level.

Similarly, when the input signal level is shifted from the V1 level to the Vss level, the PMOS P1 must be fully turned off. However, as the PMOS P1 and the NMOS N1 are simultaneously turned on because the PMOS P1 is not fully turned off and maintains the ON state for a predetermined time, an electric current channel is formed and hence leakage current may flow from the V2 power supply to the ground. This leakage current causes operation delay when the voltage level at the node A is shifted from the V2 level to the Vss level. Consequently, there is another problem in that the operation delay is incurred when the voltage level is shifted from the V2 level to the Vss level.

FIG. 1B shows waveforms of an input signal, an output signal and node signals. It can be seen that the above-described operation delay in the conventional level shifter is incurred.

Of course, there may be taken into account a method for improving operation performance of the level shifter by means of a method for sufficiently improving electric current drive capabilities of the NMOS N1 and the NMOS N2 to increase switching rates of the PMOS P1 and the PMOS P2. However, because this method inherently increases device size to improve the electric current drive capabilities of the NMOS N1 and the NMOS N2, a layout area of the semiconductor device is increased and a highly integrated semiconductor device cannot be implemented. When a voltage difference between the input and output signals is increased, there is a problem in that the size of the NMOS must be increased. Moreover, there is another problem in that operation delay may be caused by an inappropriate operating state caused by an undesired electric current channel in the PMOS P1 and NMOS N1 or the PMOS P2 and NMOS N2.

SUMMARY OF THE INVENTION

Therefore, the present invention has been made in view of the above problems, and it is an object of the present invention to provide a level shifter that can reduce leakage current and avoid operation delay of a device by means of pull-up and pull-down drivers and that can implement a small-sized, lightweight and highly integrated device.

In accordance with one aspect of the present invention, the above and other objects can be accomplished by the provision of a level shifter for receiving a signal of a first voltage level and outputting a signal of a second voltage level, comprising: a pull-down driver for pulling down a voltage level at an output terminal of the level shifter to a ground voltage level; and a pull-up driver and auxiliary pull-up means for pulling up the voltage level at the output terminal to the second voltage level.

Preferably, the pull-up driver comprises: a P-channel Metal Oxide Semiconductor (PMOS) transistor coupled between a source power supply and a first node for receiving a voltage at a second node through its gate, wherein the source power supply supplies the signal of the second voltage level and the second node is coupled to the output terminal of the level shifter.

Preferably, the pull-up driver comprises: a PMOS transistor coupled between the source power supply and the second node for receiving a voltage at the first node through its gate, wherein the source power supply supplies the signal of the second voltage level and the second node is coupled to the output terminal of the level shifter.

Preferably, the pull-up driver comprises: a first PMOS transistor coupled between a source power supply and a first node for receiving a voltage at a second node through its gate, the source power supply supplying the signal of the second voltage level; and a second PMOS transistor coupled between the source power supply and the second node for receiving a voltage at the first node through its gate, the second node being coupled to the output terminal of the level shifter.

Preferably, the auxiliary pull-up means comprises at least one pull-up transistor.

In accordance with another aspect of the present invention, the above and other objects can be accomplished by the provision of a level shifter for receiving a signal of a first voltage level and outputting a signal of a second voltage level, comprising: a pull-down driver for pulling down a voltage level at an output terminal of the level shifter to a ground voltage level; and a pull-up driver and at least one switch device for pulling up the voltage level at the output terminal to the second voltage level, the at least one switch device being coupled to the pull-up driver and enabled by a predetermined control signal.

Preferably, the pull-up driver comprises: a first PMOS transistor coupled between a source power supply and a first node for receiving a voltage at a second node through its gate, the source power supply supplying the signal of the second voltage level; and a second PMOS transistor coupled between the source power supply and the second node for receiving a voltage at the first node through its gate, the second node being coupled to the output terminal of the level shifter.

Preferably, the at least one switch device is coupled between the source power supply coupled to the first PMOS transistor and the first node.

Preferably, the at least one switch device is coupled between the source power supply coupled to the second PMOS transistor and the second node.

Preferably, the at least one switch device comprises: a first switch device coupled between the source power supply coupled to the first PMOS transistor and the first node; and a second switch device coupled between the source power supply coupled to the second PMOS transistor and the second node.

Preferably, the at least one switch device is an NMOS transistor enabled in response to the predetermined control signal applied through its gate.

Preferably, the first switch device is turned on when an input signal of the level shifter has the first voltage level.

Preferably, the second switch device is turned on when an input signal of the level shifter has the ground voltage level.

Preferably, the first switch device is turned on when an input signal of the level shifter has the first voltage level, and wherein the second switch device is turned on when an input signal of the level shifter has the ground voltage level.

Operation of the level shifter in accordance with the above-described constitution of the present invention will be described in detail.

When an input signal level is shifted from a Vss level to a V1 level, a second N-channel Metal Oxide Semiconductor (NMOS) transistor at an output terminal of a pull-down driver is turned on and then a signal at a second node coupled to a drain of the second NMOS transistor is pulled down. At this point, a first P-channel Metal Oxide Semiconductor (PMOS) transistor at an input terminal of a pull-up driver receives the Vss level signal based on the pull-down operation from the second node through its gate and pulls up a signal at a first node coupled to the drain of the first PMOS transistor, such that a second PMOS transistor at the output terminal of the pull-up driver is turned off. Here, the present invention provides auxiliary pull-up means (or a predetermined switch device) between a source and a drain of the first PMOS transistor so that it can pull up a voltage of the first node at a fast rate. Thus, the second PMOS transistor can perform a fast OFF operation and a fast voltage level-shifting operation for the voltage at the second node and the output signal of the level shifter can be performed.

Moreover, when the input signal level is shifted from a V1 level to a Vss level, the first NMOS transistor at the input terminal of the pull-down driver is turned on and then a signal at the first node coupled to the drain of the first NMOS transistor is pulled down. At this point, the second PMOS transistor at the output terminal of the pull-up driver receives the Vss level signal based on the pull-down operation from the first node through its gate and pulls up a signal at the second node coupled to the drain of the second PMOS transistor, such that the first PMOS transistor at the input terminal of the pull-up driver is turned off. Here, the present invention provides auxiliary pull-up means (or a predetermined switch device) between the source and the drain of the second PMOS transistor so that it can pull up a voltage of the second node at a fast rate. Thus, the first PMOS transistor can perform a fast OFF operation and a fast voltage level-shifting operation for the voltage at the first node and the output signal of the level shifter can be performed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
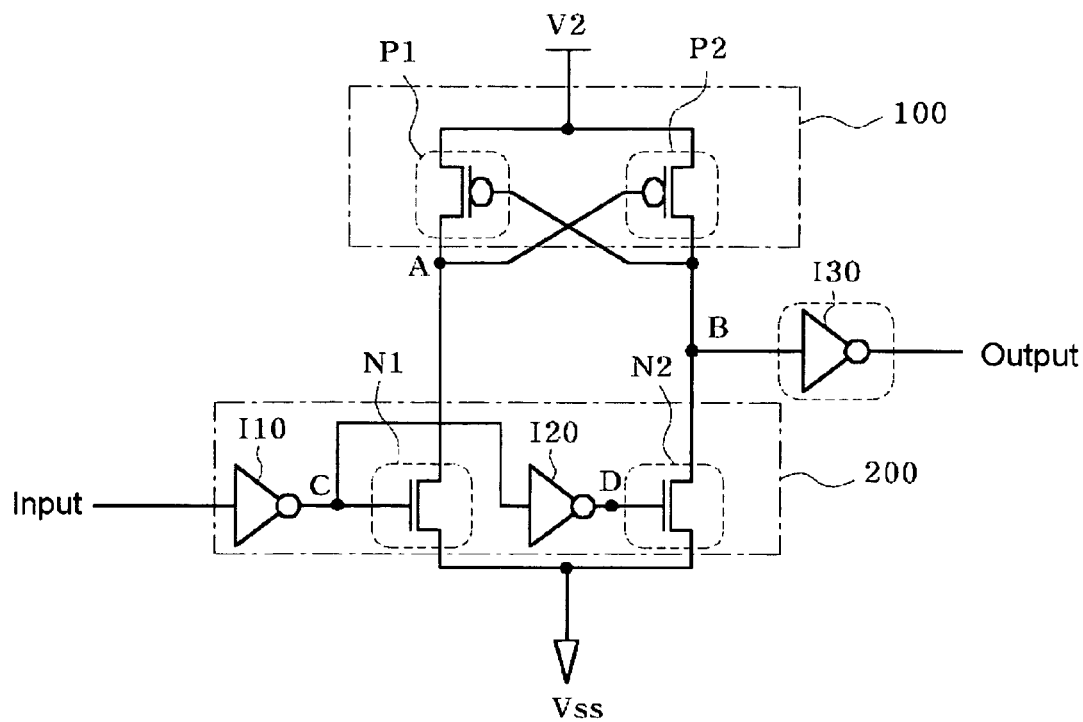
FIG. 1A is a circuit diagram illustrating a conventional level shifter.
Figure 1B:
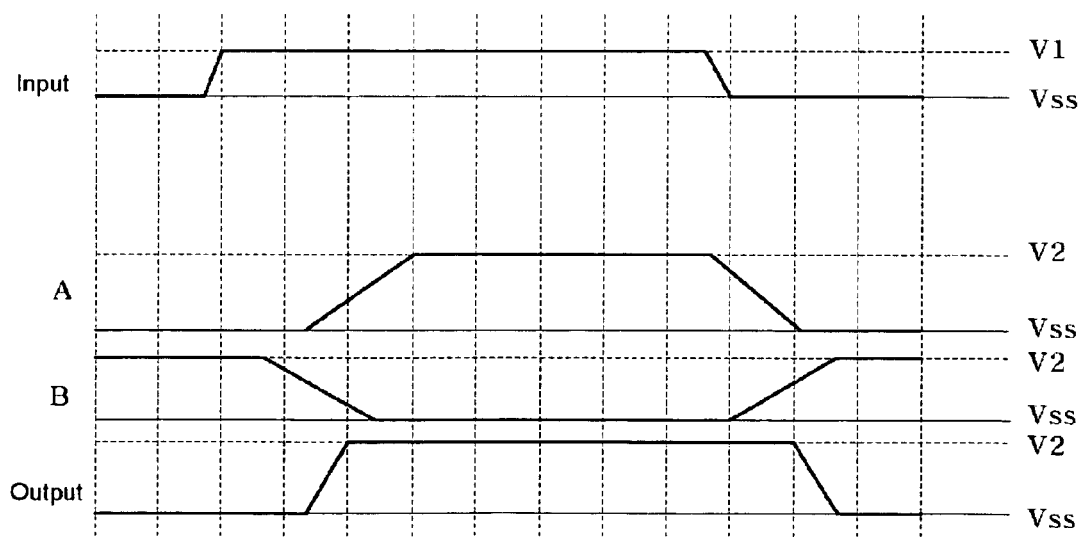
FIG. 1B shows an operation waveform of the conventional level shifter.

Now, preferred embodiments in accordance with the present invention will be described in detail with reference to the annexed drawing. The preferred embodiments of the present invention have been disclosed for illustrative purposes. The scope of the present invention is not limited by the embodiments. In the drawings, the same or similar elements are denoted by the same reference numerals even though they are depicted in different drawings.

Figure 2A:
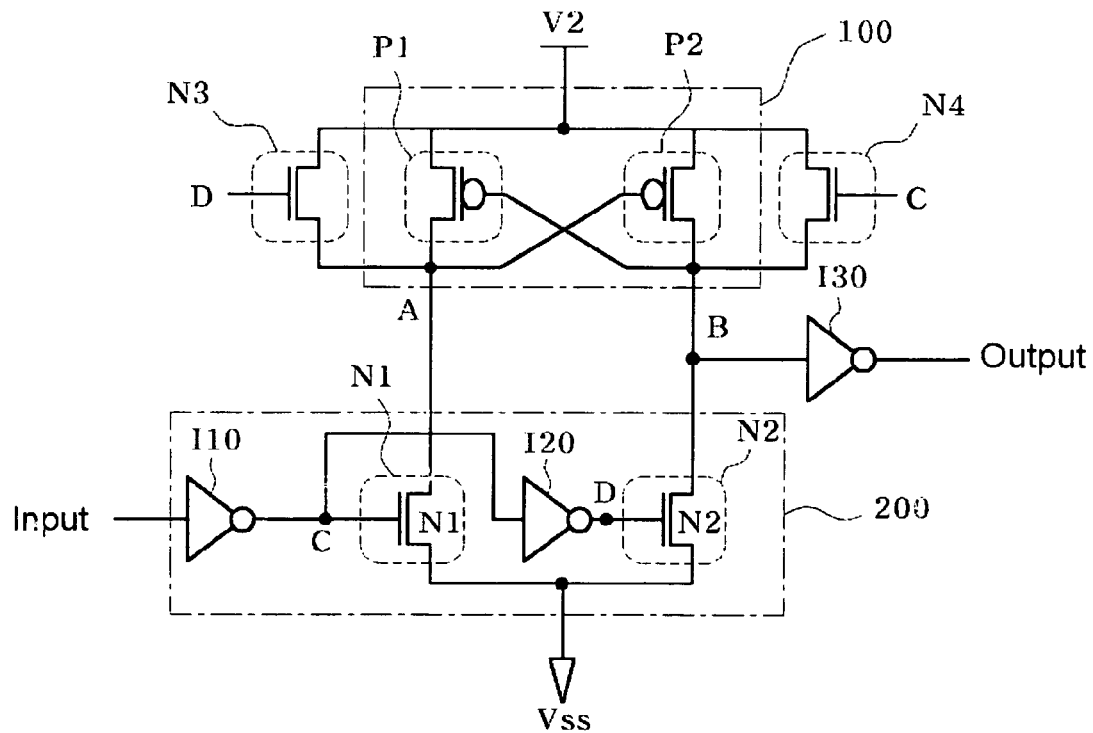
FIG. 2A is a circuit diagram illustrating a level shifter in accordance with a first embodiment of the present invention.

FIG. 2A is a circuit diagram illustrating a level shifter in accordance with a first embodiment of the present invention.

As shown in FIG. 2A, the level shifter in accordance with the first embodiment of the present invention includes a pull-up driver 100 for pulling up a voltage level at a node A or B to a V2 level in response to an input signal; a pull-down driver 200 for pulling down the voltage level at the node A or B to a ground voltage level; and a plurality of auxiliary pull-up devices or switch devices coupled to the pull-up driver 100 for pulling up the voltage level at the node A or B. The level shifter further includes an inverter I10 for inverting the input signal; an inverter I20 for inverting a signal from the node C and outputting the inverted signal to a node D; and an inverter I30 for inverting a signal from the node B and outputting the inverted signal to an output terminal of the level shifter.

Here, the pull-up driver 100 includes a P-channel Metal Oxide Semiconductor (PMOS) transistor (hereinafter, referred to as "PMOS") P1 for pulling up the voltage level at the node A and a PMOS P2 for pulling up the voltage level at the node B. The pull-down driver 200 includes an N-channel Metal Oxide Semiconductor (NMOS) transistor (hereinafter, referred to as "NMOS") N1 for pulling down the voltage level at the node A and a NMOS N2 for pulling down the voltage level at the node B. The plurality of auxiliary pull-up devices or switch devices include an NMOS N3 coupled between source and drain terminals of the PMOS P1, and an NMOS N4 coupled between source and drain terminals of the PMOS P2. The plurality of auxiliary pull-up devices or switch devices operate so that the voltage level at the node A or B can be rapidly pulled up.

Operation of the above-described embodiment will be described in detail.

First, when an input signal inputted into the level shifter is a Vss level signal, voltage levels at respective nodes and a voltage level of an output signal are the same as in the conventional level shifter. That is, the inverter I10 inverts the input signal and a voltage at the node C has a V1 level, such that the NMOS N1 is in an ON state and a voltage at the node A is in a Vss level state by a pull-down operation. Subsequently, the PMOS P2 is turned on in response to a Vss level signal at the node A, and a voltage at the node B is in a V2 level state by a pull-up operation. Consequently, when the input signal is the Vss level signal, the voltage of an output signal of the level shifter has the Vss level after a signal from the node B is inverted by the inverter I30. Here, the NMOS N2 receives the Vss level signal from the node D through its gate and is in an OFF state, and the PMOS P1 receives the V2 level signal from the node B and is in the OFF state.

At this point, when the input signal is shifted from the Vss level signal to the V1 level signal, a voltage level at the node C is shifted from the V1 level to the Vss level. The NMOS N1 receiving the Vss level signal through its gate is turned off. After the inverter I20 inverts the signal from the node C, a voltage level at the node D is shifted from the Vss level to the V1 level. As the NMOS N2 receives the V1 level signal from the node D through its gate and is switched from the OFF state to the ON state, a voltage level at the node B is shifted from the V2 level to the Vss level by the pull-down operation. Thus, a voltage level of the output signal is shifted from the Vss level to the V2 level. At this point, as the voltage level at the node B is shifted from the V2 level to the Vss level, the PMOS P1 receives the Vss level signal through its gate and is switched from the OFF state to the ON state, such that the voltage level at the node A is pulled up to the V2 level by the pull-up operation.

Here, in order for the voltage level at the node B to be rapidly shifted from the V2 level to the Vss level when the input signal level is shifted from the Vss level to the V1 level, the PMOS P2 must be rapidly turned off at a time point when the NMOS N2 is turned on. For this, the present invention provides the NMOS N3 serving as the auxiliary pull-up device coupled between the source and drain of the PMOS P1. That is, at a time point when the input signal level is shifted from Vss to V1, the NMOS N3 receives a predetermined control signal through its gate so that the voltage level at the node A is pulled up to the V2 level and the PMOS P2 can be rapidly turned off in response to the V2 level. Here, the NMOS N3 can receive the signal from the node D based on a change of the input signal as the predetermined control signal. Alternatively, the NMOS N3 can operate in response to a special control signal.

Therefore, before the PMOS P1 is turned on in response to a Vss level voltage inputted from the node B through its gate in order to pull up a signal at the node A, the signal at the node A can be pulled up to the V2 level and hence the PMOS P2 can be turned off in accordance with the present invention. The inventive level shifter can perform a faster voltage-level shifting operation than the conventional level shifter. Moreover, leakage current incurable when the NMOS N2 and the PMOS P2 are simultaneously turned can be avoided.

On the other hand, when the input signal level is again shifted from the V1 level to the Vss level, the voltage level at the node C is shifted from the Vss level to the V1 level and the NMOS N1 is turned on. Thus, the voltage at the node A is shifted from the V2 level to the Vss level by the pull-down operation. Because the PMOS P2 receives the voltage of the Vss level from the node A and is switched from the OFF state to the ON state, the voltage level at the node B is shifted from the Vss level to the V2 level by the pull-up operation. Thus, after the inverter I30 inverts the signal from the node B, the output signal level is shifted from the V2 level to the Vss level. At this point, as the voltage level at the node D is shifted from the V1 level to the Vss level, the NMOS N2 is switched from the ON state to the OFF state. The PMOS P1 receives the voltage of the V2 level from the node A through its gate and is switched from the ON state to the OFF state.

However, in order for the voltage level at the node B to be rapidly shifted from the Vss level to the V2 level when the input signal level is shifted from the V1 level to the Vss level, the voltage level at the node A must be able to be rapidly shifted from the V2 level to the Vss level and hence the PMOS P2 must be able to be turned on. Moreover, in order for the voltage level at the node A to be rapidly shifted to the Vss level, the PMOS P1 must be rapidly turned off at a time point when the NMOS N1 is turned on.

To solve this technical subject, the present invention provides the NMOS N4 serving as the auxiliary pull-up device coupled between the source and drain of the PMOS P2. That is, at a time point when the input signal level is shifted from V1 to Vss, the NMOS N4 receives a predetermined control signal through its gate so that the voltage level at the node B is pulled up to the V2 level and the PMOS P2 can be rapidly turned off in response to the V2 level. Here, the NMOS N4 can receive the signal from the node C based on a change of the input signal as the predetermined control signal. Alternatively, the NMOS N4 can operate in response to a special control signal.

Therefore, before the PMOS P2 is turned on in response to a Vss level voltage inputted from the node A through its gate in order to pull up a signal at the node B, the signal at the node B can be pulled up to the V2 level and hence the PMOS P1 can be turned off in accordance with the present invention. The inventive level shifter can perform a faster voltage level-shifting operation than the conventional level shifter. Moreover, leakage current incurable when the NMOS N1 and the PMOS P1 are simultaneously turned on can be avoided.

Consequently, the present invention can avoid a phenomenon in which the PMOS P1 and NMOS N1 or the PMOS P2 and NMOS N2 are simultaneously turned on by coupling the NMOS N3 serving as a predetermined auxiliary pull-up device to the PMOS P1 provided in the pull-up driver 100 and coupling the NMOS N4 serving as a predetermined auxiliary pull-up device to the PMOS P2 provided in the pull-up driver 100. Thus, leakage current can be reduced between the V2 power supply and ground, and operation delay of the semiconductor memory device can be avoided. Moreover, because a size of each device does not need to be increased so that electric drive capabilities of the NMOS N1 and the NMOS N2 are improved, there is a merit in that a small-sized, lightweight and highly integrated semiconductor memory device can be improved.

Figure 2B:
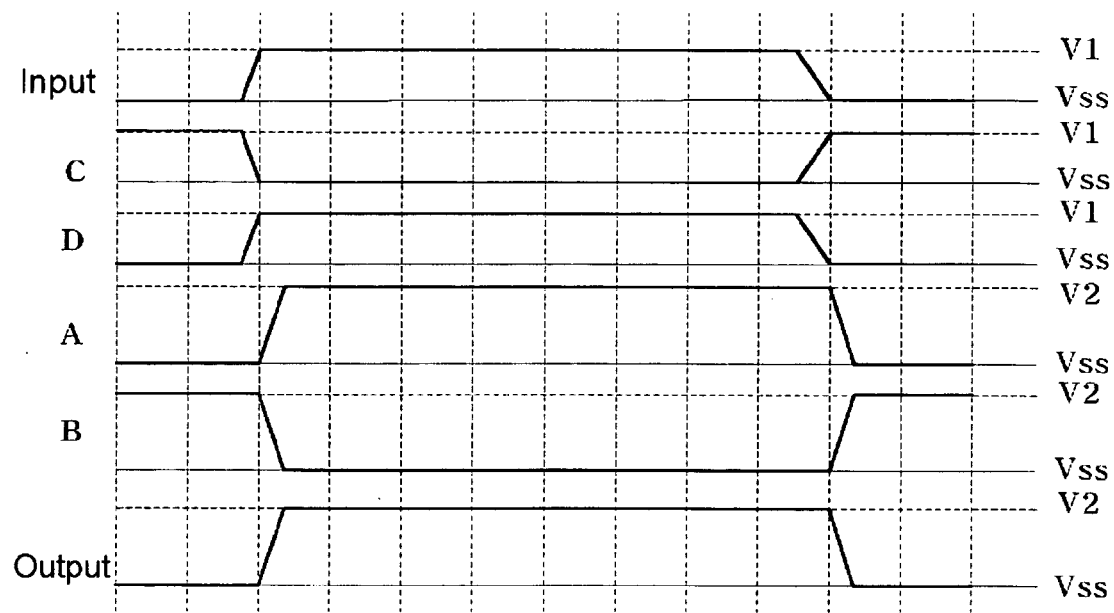
FIG. 2B shows an operation waveform of the level shifter in accordance with the first embodiment of the present invention.

It can be seen that node and output signals are rapidly changed according to an input signal change and a device's operating rate is increased, by reference to a waveform showing input and output signals and a voltage signal at each node in FIG. 2B.

Figure 2C:
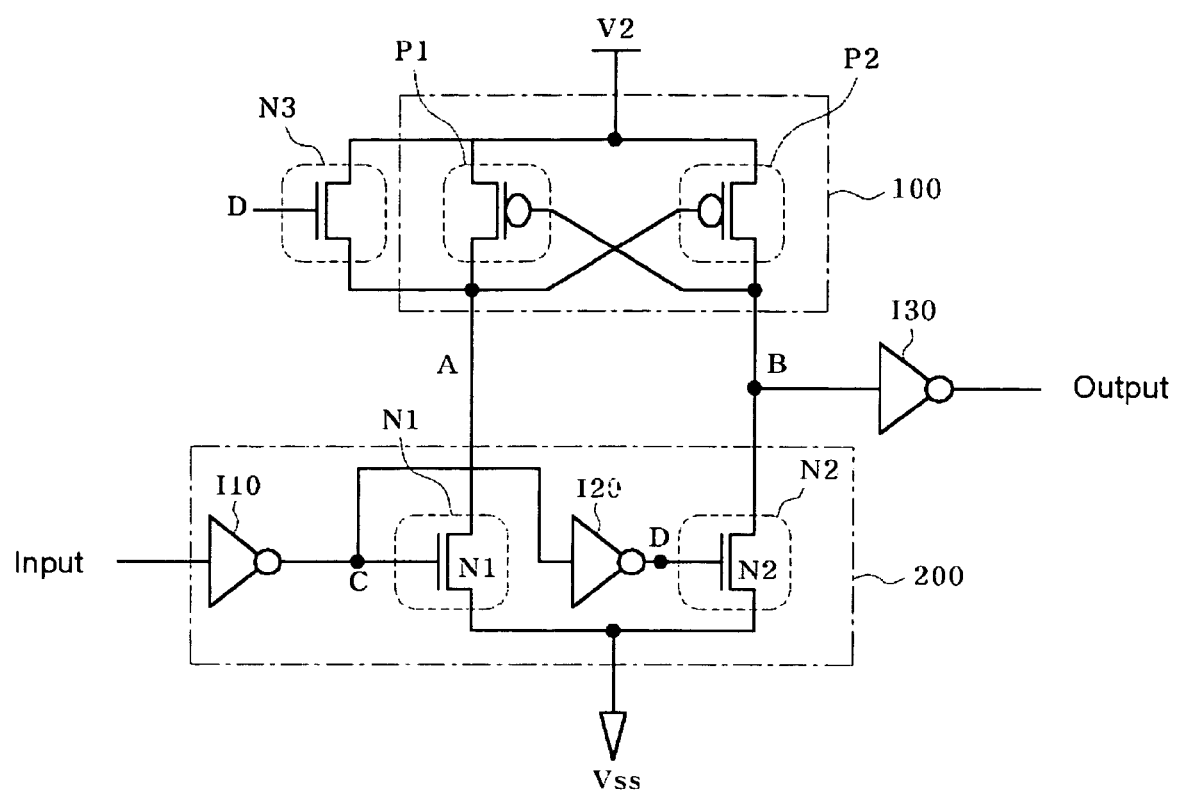
FIG. 2C is a circuit diagram illustrating a level shifter in accordance with a second embodiment of the present invention.
Figure 2D:
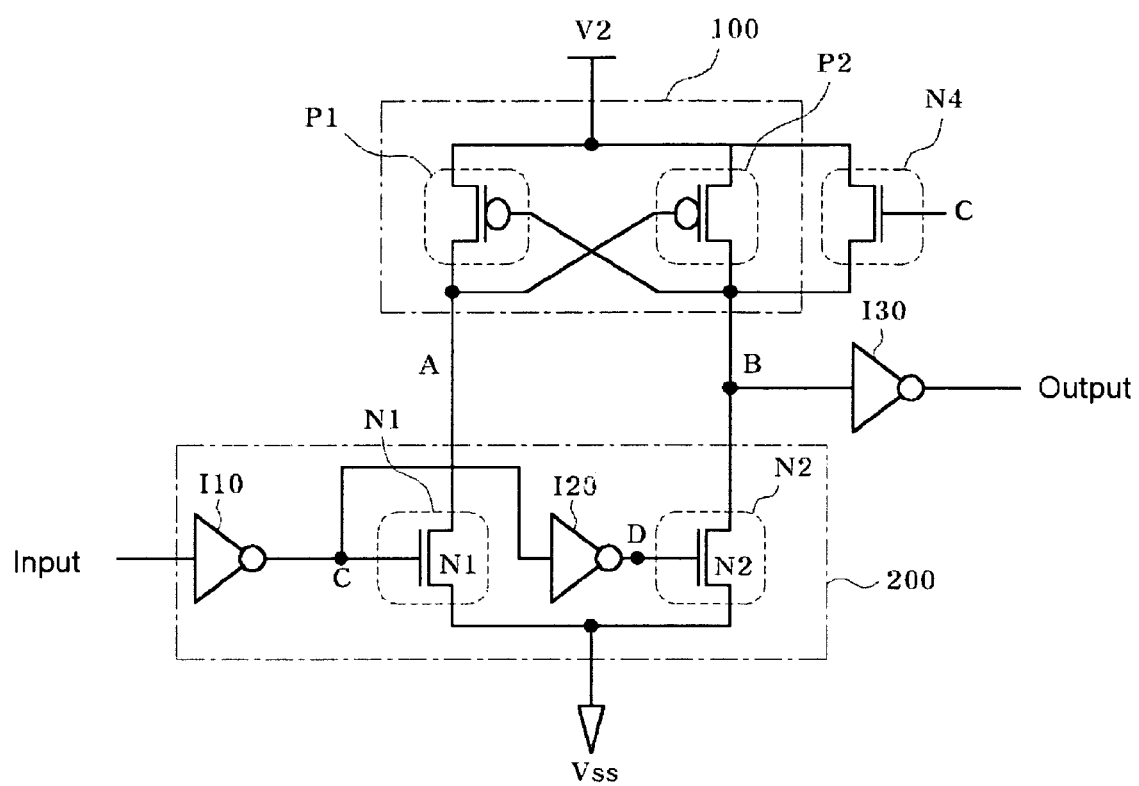
FIG. 2D shows an operation waveform of the level shifter in accordance with the second embodiment of the present invention.

In accordance with the embodiments of the present invention, the NMOS N3 or N4 serving as the auxiliary pull-up device provided in the pull-up driver 100 can be constituted so that it can perform a separate operation according to a shift form of the input signal. When a circuit is constituted, only one of the NMOS N3 and NMOS N4 can be installed as the auxiliary pull-up device as shown in FIGS. 2C and 2D.

As apparent from the above description, the present invention provides a level shifter that can reduce leakage current and avoid operation delay of a device through pull-up and pull-down drivers and that can implement a small-sized, lightweight and highly integrated semiconductor memory device when a voltage level is shifted therein, as an auxiliary pull-up device is applied to pulling up a voltage level at an output terminal of the level shifter to a second voltage level.

What is claimed is:

1. A level shifter for receiving a signal of a first voltage level and outputting a signal of a second voltage level, comprising:

a pull-down driver for pulling down a voltage level at an output terminal of the level shifter to a ground voltage level;

a pull-up driver for pulling up the voltage level at the output terminal to the second voltage level; and an auxiliary pull-up means for pulling up the voltage level at the output terminal to the second voltage level, the auxiliary pull-up means comprising a first N-channel Metal Oxide Semiconductor (NMOS) transistor coupled between a source power supply and a first node, and a second NMOS transistor coupled between the source power supply and a second node, the source power supply supplying the signal of the second voltage level, the second node being coupled to the output terminal of the level shifter.

2. The level shifter of claim 1, wherein the pull-up driver comprises:
   a first pull-up transistor coupled between the source power supply and the first node for receiving a voltage at the second node through its gate; and
   a second pull-up transistor coupled between the source power supply and the second node for receiving a voltage at the first node through its gate.

3. A level shifter for receiving a signal of a first voltage level and outputting a signal of a second voltage level, comprising:
   a pull-down driver for pulling down a voltage level at an output terminal of the level shifter to a ground voltage level;
   a pull-up driver for pulling up the voltage level at the output terminal to the second voltage level; and
   a switch device for being coupled to the pull-up driver and enabled by a predetermined control signal, the switch device comprising a first switch device coupled between a source power supply and a first node, and a second switch device coupled between the source power supply and a second node, the source power supply supplying the signal of the second voltage level, the second node being coupled to the output terminal of the level shifter.

4. The level shifter of claim 3, wherein the pull-up driver comprises:
   a first pull-up transistor coupled between the source power supply and the first node for receiving a voltage at the second node through its gate; and
   a second pull-up transistor coupled between the source power supply and the second node for receiving a voltage at the first node through its gate.

5. The level shifter of any one of claims 3 or 4, wherein the first and second switch device are an N-channel Metal Oxide Semiconductor (NMOS) transistor enabled in response to the predetermined control signal applied through its gate.

6. The level shifter of claim 3 or 4, wherein the first and second switch device are turned on when an input signal of the level shifter has the ground voltage level.

7. The level shifter of claim 3 or 4, wherein the first switch device is turned on when an input signal of the level shifter has the first voltage level, and wherein the second switch device is turned on when an input signal of the level shifter has the ground voltage level.

* * * * *